United States Patent
Black (10) Patent No.: US 6,456,823 B1
(45) Date of Patent: Sep. 24, 2002

(54) SYSTEM AND METHOD FOR RECOVERING A PILOT TONE IN A LOCAL MULTIPOINT DISTRIBUTION SYSTEM SIGNAL

(75) Inventor: Michael F. Black, Garland, TX (US)

(73) Assignee: Raytheon Company, Lexington, MA (US)

( * ) Notice: Subject to any disclaimer, the term of this patent is extended or adjusted under 35 U.S.C. 154(b) by 0 days.

(21) Appl. No.: 09/344,747

(22) Filed: Jun. 25, 1999

(51) Int. Cl.[7] .................................................. H04H 1/00
(52) U.S. Cl. ...................... 455/3.01; 455/3.06; 455/76; 375/376
(58) Field of Search ................... 455/3.01, 3.06, 455/75, 76, 86, 260, 265; 375/375, 376

(56) References Cited

U.S. PATENT DOCUMENTS

| | | | | |
|---|---|---|---|---|
| 4,683,445 A | * | 7/1987 | Erickson | 331/25 |
| 5,844,939 A | * | 12/1998 | Scherer et al. | 375/219 |
| 6,005,894 A | * | 12/1999 | Kumar | 375/270 |
| 6,212,397 B1 | | 4/2001 | Langston et al. | |

* cited by examiner

Primary Examiner—Lee Nguyen
(74) Attorney, Agent, or Firm—Baker Botts L.L.P.

(57) ABSTRACT

An intermediate frequency signal (50) is received by a difference frequency generator (43). The intermediate frequency signal (50) includes a pilot tone frequency. A band pass filter (64) removes frequencies surrounding the pilot tone frequency. A phase lock loop (66) generates a pilot tone signal from the pilot tone frequency. A divisor (74) divides the frequency of the pilot tone signal by a specified number. A second phase detector (76) determines a frequency difference between the pilot tone signal and a stable frequency signal generated by a stable frequency oscillator (78). A control voltage for a difference frequency voltage controlled dielectric resonant oscillator (84) is adjusted based on the frequency difference. A system frequency signal (48) is downconverted to an intermediate frequency signal (50) using a difference frequency signal (54).

23 Claims, 4 Drawing Sheets

SYSTEM AND METHOD FOR RECOVERING A PILOT TONE IN A LOCAL MULTIPOINT DISTRIBUTION SYSTEM SIGNAL

TECHNICAL FIELD OF THE INVENTION

This invention relates in general to the field of electronic signal processing and more particularly to a system and method for recovering a pilot tone in a local multipoint distribution system signal.

BACKGROUND OF THE INVENTION

A Local Multipoint Distribution System (LMDS) is a point to multipoint radio frequency communication system. It operates in the United States using frequency bands between 26 GHz and 29 GHz. The specific frequencies assigned to LMDS varies by country and is generally in the 10 GHz to 40 GHz frequency range. The frequency range set aside for LMDS requires a line of sight between the transmitting device and receiving device. LMDS may be used to provide and distribute telecommunication services, data communication services, and video services.

The LMDS head end and customer premises operate on an intermediate frequency. The intermediate frequency allows existing modems to communicate with digital electronic devices. Prior to transmission at the head end, the intermediate frequency signal is translated, or upconverted, to the appropriate LMDS frequency band. A receiver at the customer premises receives the LMDS signal and translates, or downconverts, the LMDS signal from the LMDS frequency band to an intermediate frequency suitable for processing at the customer premises. Communications in the gigahertz frequency range requires signals with very stable frequencies. The head end, or node, has very expensive oscillators for maintaining stable frequencies. The customer premises equipment needs lower cost equipment which generally cannot maintain a stable frequency.

A constant signal at a specified frequency is used to synchronize the oscillators in the customer premises equipment with the head end transmission equipment. This constant signal at a specified frequency is referred to as the pilot tone. The pilot tone is generally a low amplitude, fixed frequency signal at the lower end of the frequency range assigned for LMDS communications. The customer premises equipment locates the pilot tone in the signal received from the LMDS head end and synchronizes its equipment to generate a signal at the same frequency. After synchronization of the oscillators in the customer premises equipment, the customer premises equipment can extract the LMDS signals in the remaining LMDS bandwidth.

Conventional pilot tone recovery systems utilize surface acoustic wave (SAW) filters to locate the pilot tone signal within the LMDS transmission. SAW filters can be expensive and difficult to fabricate. In addition, SAW filters cannot be formed on a monolithic integrated circuit. Therefore, it is desirable to effectively and efficiently recover the pilot tone within a LMDS transmission.

SUMMARY OF THE INVENTION

From the foregoing, it may be appreciated that a need has arisen for an effective and efficient pilot tone recovery system. In accordance with the present invention, an improved system and method for recovering a pilot tone in an LMDS signal are provided which substantially eliminate or reduce disadvantages and problems associated with conventional pilot tone recovery systems.

According to an embodiment of the present invention, there is provided a method for recovering a pilot tone in an LMDS signal that includes receiving an intermediate frequency signal that contains a pilot tone frequency and removing frequencies surrounding the pilot tone frequency. A pilot tone signal is then generated from the pilot tone frequency. The frequency of the pilot tone signal is then divided by a specified number and compared to a stable frequency signal to determine a frequency difference between the divided pilot tone signal and the stable frequency signal. An output frequency of a voltage controlled oscillator is adjusted based on the frequency difference. A system frequency signal is then downconverted to the intermediate frequency signal.

The present invention provides various technical advantages over conventional pilot tone recovery systems. For example, one technical advantage is providing an improved system and method for recovering a pilot tone in an LMDS signal. In particular, the pilot tone recovery system utilizes components capable of fabrication on a monolithic integrated circuit. In addition, the pilot tone recovery system improves the signal to noise ratio of the received pilot tone. Other technical advantages may be readily apparent to one skilled in the art from the following figures, description, and claims.

BRIEF DESCRIPTION OF THE DRAWINGS

For a more complete understanding of the present invention and the advantages thereof, reference is now made to the following description taken in conjunction with the accompanying drawings, wherein like reference numbers represent like parts, in which.

DETAILED DESCRIPTION

Figure 1:
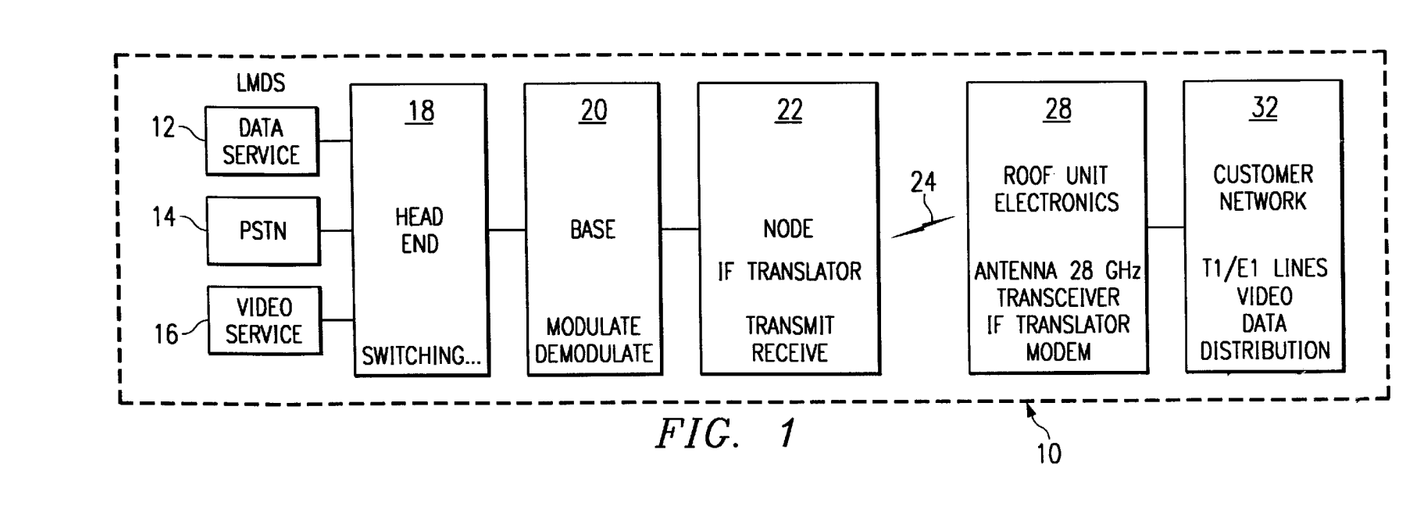
FIG. 1 is a block diagram of a Local Multipoint Distribution System.

Referring to FIG. 1, a Local Multipoint Distribution System (LMDS) is generally indicated at 10. LMDS 10 provides a data service 12, a telephone service 14, and a video service 16 through radio frequency communications at a system frequency. LMDS 10 may be assigned a system frequency in the range of approximately 10 GHz to 40 GHz. In one embodiment, the system frequency is 27.36 GHz. Data service 12 may be any suitable data service such as an Internet connection. Telephone service 14 may include providing a customer with a wireless connection to the public switched telephone network. Video service 16 may include local broadcast television stations, satellite broadcast stations, and any other suitable video source. LMDS 10 may provide any service suitable for transmission and reception over a wireless connection.

Data service 12, telephone service 14, and video service 16 are coupled to a head end 18. Head end 18 provides initial switching for telephone service 14 and allocation of video service 16 and data service 12 to available channels, or bandwidth segments, within the LMDS bandwidth. Head end 18 combines the various signals from the available services into a combined LMDS signal and forwards the combined LMDS signal to a base unit 20 where the signal is modulated onto an intermediate frequency carrier wave. LMDS 10 uses an intermediate frequency so that existing modems and other electronic devices may be used. In one embodiment the intermediate frequency is 960 MHz. When base unit 20 functions in reception mode, it demodulates the incoming signal for processing by head end 18.

A node 22, is coupled to base unit 20 and translates the intermediate frequency signal to the assigned LMDS system frequency to give an LMDS signal 24. Node 22 then transmits the LMDS signal 24 to a customer's premises.

A roof unit electronics 28 receives the LMDS signal 24 and translates the signal from the system frequency to the intermediate frequency. Roof unit electronics 21 then demodulates the intermediate frequency signal for processing by a customer network 32. Roof unit electronics 28 may also receive a signal from customer network 32, modulate the signal onto an intermediate frequency carrier wave, and translate the intermediate frequency signal to an LMDS system frequency signal for transmission. Customer network 32 may provide telephone lines to each telephone within the customer's premises as well as video and data distribution networks.

Figure 2:
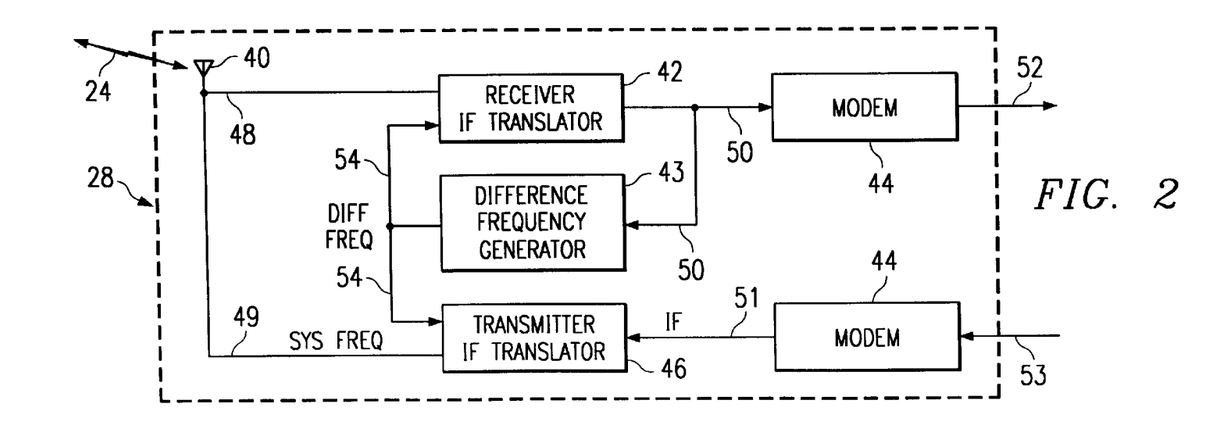
FIG. 2 is a block diagram of a roof unit electronics associated with a customer's premises for a local multipoint distribution system.

Referring to FIG. 2, the roof unit electronics is generally indicated at 28. An antenna 40 is coupled to a receiver translator 42 and a transmitter translator 46. A difference frequency generator 43 is coupled to receiver translator 42 in a feedback loop arrangement. Difference frequency generator 43 is also coupled to transmitter translator 46. A modem 44 is coupled to both receiver translator 42 and transmitter translator 46.

LMDS signals 24 are collected by antenna 40. Antenna 40 forwards a system frequency signal 48 to receiver translator 42. System frequency signal 48 is at a system frequency which, for purposes of discussion and by example only, is approximately 27.36 GHz. Receiver translator 42 downconverts the system frequency signal 48 to an intermediate frequency signal 50. As previously stated, the intermediate frequency for LMDS 10 is preferably 960 MHz though other intermediate frequencies may be used depending on the system frequency being implemented. The down conversion to intermediate frequency signal 50 allows existing modems 44 to be used in roof unit electronics 28.

Receiver IF translator 42 removes a difference frequency signal 54 from system frequency signal 48 yielding intermediate frequency signal 50. For this discussion, the difference frequency signal 54 is a signal at 26.4 GHz. With the intermediate frequency being 960 MHz, the system frequency (27.36 GHz) minus the intermediate frequency (960 MHz) yields the difference frequency (26.4 GHz). By removing difference frequency signal 54 from system frequency signal 48, receiver translator 42 translates, or downconverts, the incoming LMDS signal 24 to an intermediate frequency signal 50.

Difference frequency generator 43 generates a stable signal, difference frequency signal 54, which is the difference between the system frequency and the intermediate frequency. Difference frequency generator 43 is arranged in a feedback loop for receiver translator 42. The output of receiver translator 42, intermediate frequency signal 50, provides the input for difference frequency generator 43.

The output of difference frequency generator 43, difference frequency signal 54, provides one of two inputs for receiver translator 42. Receiver translator 42 forwards intermediate signal 50 to modem 44 where intermediate frequency signal 50 is demodulated to provide a customer network signal 52. Customer network signal 52 is a digital signal feeding customer network 32 equipment.

This feedback loop assures that the pilot tone is recovered from system frequency signal 48 and that oscillates within roof unit electronics 28 are synchronized to oscillators within head end 18. The feedback loop allows difference frequency generator 43 to adjust its output until the proper frequency for difference frequency signal 54 is obtained. Since difference frequency generator 43 is coupled to receiver translator 42 in a feedback loop, difference frequency signal 54 is a stable signal at the difference frequency.

Roof unit electronics 28 also transmits signals from customer network 32 back to node 22. Modem 44 takes customer network transmission signal 53 and modulates the signal onto an intermediate frequency carrier wave yielding a transmission signal 51. Transmission signal 51 is forwarded to transmitter translator 46 where transmission signal 51 is upconverted to the system frequency by adding difference frequency signal 54 to transmission signal 51 to give a system frequency transmission signal 49. Transmitter translator 46 forwards system frequency transmission signal 49 to antenna 40 where system frequency transmission signal 49 is transmitted as LMDS signal 24 to node 22. Thus, only difference frequency signal 54 is provided to transmitter translator 46 to be used in upconverting transmission signal 51 to the system frequency for system frequency transmission signal 49.

Figure 3:
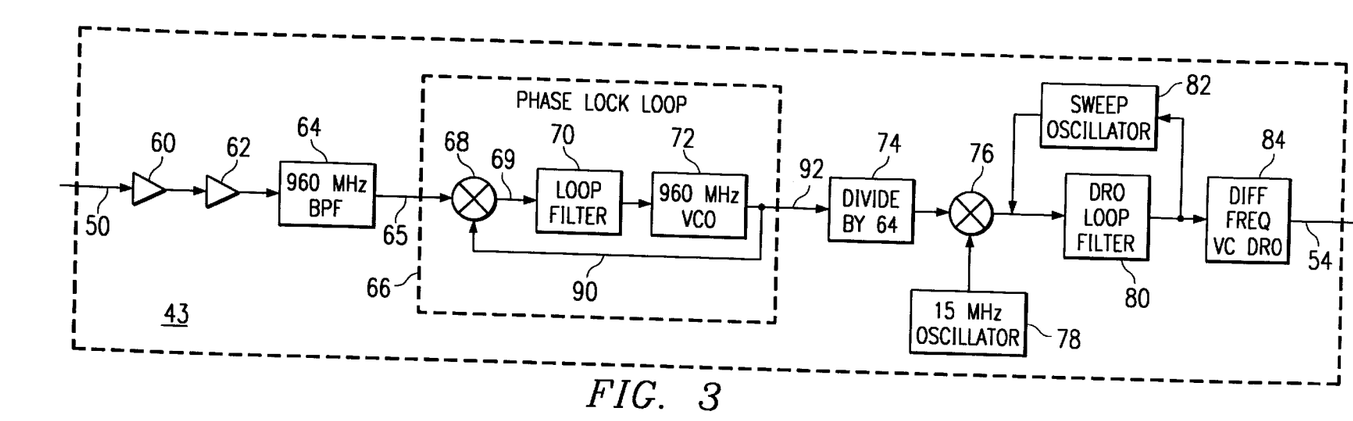
FIG. 3 is a block diagram of a difference frequency generator used in the roof unit electronics.

Referring to FIG. 3, the difference frequency generator is generally indicated at 43. Difference frequency generator 43 generates a stable signal at a constant frequency equal to the difference between the system frequency and the intermediate frequency. The system frequency is the frequency at which LMDS 10 transmits and receives wireless signals. The intermediate frequency is the frequency at which modems in base unit 20 and roof unit electronics 28 can modulate or demodulate signals.

Difference frequency generator 43 receives intermediate frequency signal 50 as an input. Intermediate frequency signal 50 contains a low powered pilot tone for use in synchronizing oscillators in roof unit electronics 28. The pilot tone is preferably located at the lower end of the system frequency range, and, after downconversion, at the lower end of the intermediate frequency range. Intermediate frequency signal 50 is sent through a first amplifier 60 and a second amplifier 62 to amplify intermediate frequency signal 50. A band pass filter 64 is coupled to the output of second amplifier 62 and filters intermediate frequency signal 50. A bandpass filter 64 isolates the pilot tone frequency from intermediate frequency signal 50.

The output of band pass filter 64 is coupled to a phase lock loop 66 that consists of a first phase detector 68 coupled to a loop filter 70. Loop filter 70 is further coupled to a voltage controlled oscillator (VCO) 72. The output of VCO 72 is coupled to a first phase detector 68 by a feedback loop signal 90. A phase lock loop (PLL) output 92 is coupled to a divisor 74. Divisor 74 is coupled to a second phase detector 76 as is a stable frequency oscillator 78. The output of second phase detector 76 is coupled to a dielectric resonant oscillator (DRO) loop filter 80.

A sweep oscillator 82 is coupled, in a feedback loop, to the input and output of DRO loop filter 80. Sweep oscillator 82 provides an initiating signal for difference frequency signal generator 43 when roof unit electronics 28 is initialized. The output of DRO loop filter 80 is coupled to a difference frequency voltage controlled dielectric resonant oscillator (VCDRO) 84. Difference frequency VCDRO 84 generates difference frequency signal 54.

In operation, intermediate frequency signal 50 is processed by a first amplifier 60 and a second amplifier 62 in order to increase the signal strength of intermediate frequency signal 50. In one embodiment, first amplifier 60 and second amplifier 62 are thirty decibel amplifiers. The output of second amplifier 62 provides the input for band pass filter 64.

Bandpass filter 64 removes signals in the frequency ranges above and below the pilot tone frequency. In one embodiment, the pilot tone frequency is 960 MHz. When signals outside the pilot tone frequency are removed, the pilot tone will be readily ascertainable. After bandpass filter 64 removes signals outside the pilot tone frequency, the remaining signal is a filtered signal 65.

Phase lock loop 66 receives filtered signal 65 and further filters the signal to recover the pilot tone. Phase lock loop 66 removes noise and interference from filtered signal 65 producing a strong signal at the same frequency as filtered signal 65. First phase detector 68 receives filtered signal 65 and feedback loop signal 90 and generates a PLL difference signal 69. When the output of first phase detector 68 is a zero value, the frequencies of the two inputs, filtered signal 65 and loop signal 90, are identical. When that happens, the frequency of the input to phase lock loop 66 is identical to the frequency of PLL output 92. In effect, phase lock loop 66 serves as a form of narrow band frequency adaptive filter.

Loop filter 70 converts PLL difference signal 69 to an input control voltage for VCO 72. Loop filter 70 provides the input to VCO 72 and is preferably an operational amplifier. The output of VCO 72 is a feedback loop signal 90 to first phase detector 68. Feedback loop signal 90 assures that PLL output 92 is a signal at the same frequency as filtered signal 65. A voltage-controlled oscillator produces a predictable output based on an input control voltage. A change in the input control voltage will result in a predictable change in the frequency of the voltage controlled oscillator.

Divisor 74 receives PLL output 92 as an input. PLL output 92 is a signal at the pilot tone frequency. For this example, the pilot tone frequency is 960 MHz and divisor 74 is a divide by sixty-four. Therefore, the output of divisor 74 would be approximately 15 MHz. The output of divisor 74 provides one of the inputs to second phase detector 76. The second input to second phase detector 76 is provided by stable frequency oscillator 78. For this example, stable frequency oscillator 78 is a 15 MHz crystal oscillator. Stable frequency oscillator 78 generates a stable signal at a stable reference frequency. Phase detector 76 determines the difference between its two input signals.

The output of second phase detector 76 provides an input for DRO loop filter 80. DRO loop filter 80 receives the output of second phase detector 76 and generates a corresponding control voltage for difference frequency VCDRO 84. DRO loop filter 80 is preferably an operational amplifier. Difference frequency VCDRO 84 is preferably a voltage-controlled dielectric resonant oscillator that generates a difference frequency signal 54 at the difference frequency.

Sweep oscillator 82 is used in the initiation of the system to provide the proper control voltage for difference frequency VCDRO 84. System initiation occurs when power is initially provided or restored to roof unit electronics 28. System initiation also occurs when the transmission of LMDS signal 24 is interrupted for any reason such as rain or blocking by foreign objects. Sweep oscillator 82 sweeps the control voltage for difference frequency VCDRO 84 such that the output of difference frequency VCDRO 84 sweeps above and below the difference frequency by a certain frequency range. In one embodiment, the frequency range is 3 MHz above and below the difference frequency. The varying of difference frequency signal 54 allows roof unit electronics 28 to quickly lock onto and recover the pilot tone from system frequency signal 48 upon system initiation.

Figure 4:
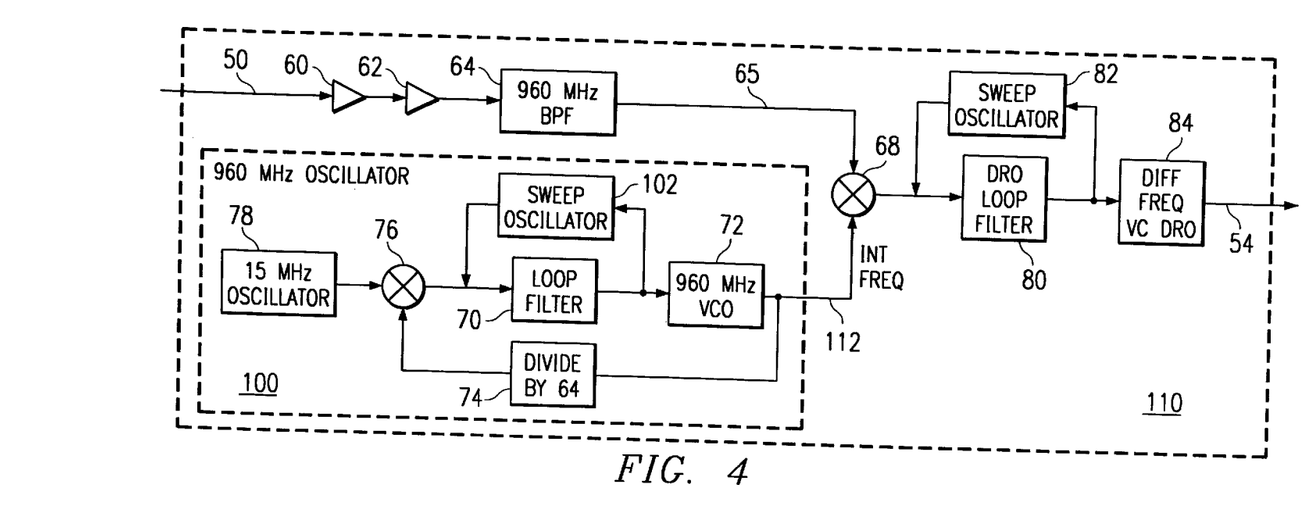
FIG. 4 is a block diagram of an alternate embodiment of the difference frequency generator.

Referring to FIG. 4, an alternate embodiment of the difference frequency generator is generally indicated at 110. Difference frequency generator 110 receives intermediate frequency signal 50 and generates a difference frequency signal 54. As in the prior embodiment, intermediate frequency signal 50 is processed by a first amplifier 60 and a second amplifier 62. The output of second amplifier 62 is processed by bandpass filter 64 to generate filtered signal 65. Filtered signal 65 is a signal at the pilot tone frequency isolated from intermediate frequency signal 50.

A first phase detector 68 compares filtered signal 65 with a reference frequency signal 112 generated by an oscillator 100. First phase detector 68 generates a difference signal which is processed by DRO loop filter 80 to generate a control voltage for difference frequency VCDRO 84. If filtered signal 65 is not at the pilot tone frequency, DRO loop filter 80 adjusts the output of difference frequency VCDRO 84 until the frequency of filtered signal 65 is the same as the frequency of reference frequency signal 112.

Oscillator 100 generates a reference frequency signal 112 at the pilot tone frequency. In one embodiment, oscillator 100 is a single unit oscillator designed to generate a signal at the pilot tone frequency. In another embodiment, a stable frequency oscillator 78 is used to provide a signal at a stable frequency for generation of reference frequency signal 112. Stable frequency oscillator 78 is preferably a crystal-controlled 15 MHz oscillator. The output of stable frequency oscillator 78 is coupled to the first input of second phase detector 76. The second input to second phase detector 76 is a feedback loop from VCO 72 to ensure that reference frequency signal 112 is generated at the pilot tone frequency. If second phase detector 76 determines a difference between the output of stable frequency oscillator 78 and reference frequency signal 112, loop filter 70 adjusts the control voltage for VCO 72. The output of VCO 72 is reference frequency signal 112.

The output of VCO 72 is coupled to a divisor 74 in the feedback loop to phase detector 76. In one embodiment, divisor 74 is a divide by sixty-four. Divisor 74 down-converts reference frequency signal 112 to the frequency generated by stable frequency oscillator 78 for comparison to the output of stable frequency oscillator 78 in second phase detector 76.

A sweep oscillator 102 is coupled in a feedback loop to the input and output of loop filter 70. When roof unit electronics is initiated, sweep oscillator 102 varies the control voltage generated by loop filter 70 thereby sweeping the output of VCO 72 until oscillator 100 generates a reference frequency signal 112 at the pilot tone frequency. Once the reference frequency signal 112 is at the pilot tone frequency, sweep oscillator 102 stops varying the output of loop filter 70.

Figure 5:
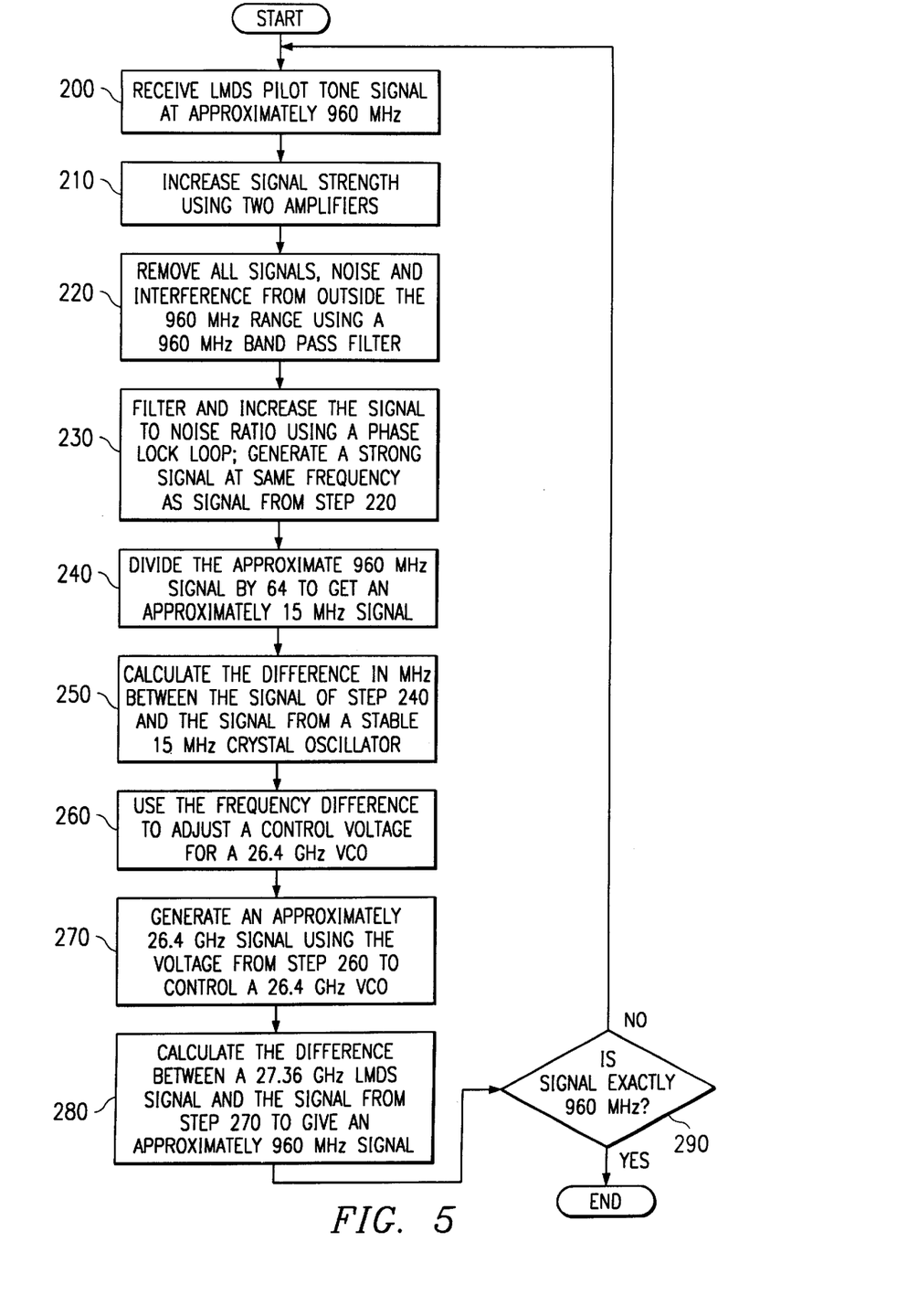
FIG. 5 is a flow diagram illustrating the generation of a difference frequency signal by the difference frequency generator.

Referring to FIG. 5, a flowchart of a method of recovering a pilot tone in an LMDS is illustrated. The method commences at step 200 where difference frequency generator 43 receives an intermediate frequency signal 50. The method proceeds to step 210 where the signal strength of intermediate frequency signal 50 is increased using first amplifier 60 and second amplifier 62. The method proceeds to step 220 where intermediate frequency signal 50 is filtered giving a filtered signal 65. Band pass filter 64 removes all signals, noise, and interference from outside a specified frequency range around the intermediate frequency in order to generated filtered signal 65. In this example, the intermediate frequency is 960 MHz.

The method proceeds to step 230 where the signal to noise ratio and the signal strength of filtered signal 65 are increased using a phase lock loop 66 to generate a PLL output 92 at the same frequency as filtered signal 65.

The method proceeds to step 240 where PLL output 92 is processed by a divisor 74 to reduce the frequency of PLL output 92. In one embodiment, divisor 74 is a divide by 64. Since PLL output is approximately 960 MHz, the output of divisor 74 is approximately 15 MHz.

The method proceeds to step 250 where a second phase detector 76 compares the approximately 15 MHz signal from step 240 with a stable reference signal generated by stable frequency oscillator 78. In one embodiment, stable frequency oscillator 78 generates a stable reference signal at 15 MHz.

The method proceeds to step 260 where the DRO loop filter 80 uses the frequency difference from step 250 to adjust a control voltage for difference frequency VCDRO 84. The method proceeds to step 270 where difference frequency VCDRO 84 generates a signal at the difference frequency using the control voltage from step 260. In this example, the difference frequency is 26.4 GHz.

The method proceeds to step 280 where a mixer determines the frequency difference between LMDS signal 24 and difference frequency signal 54 generated in step 280. The method proceeds to step 290 where a determination is made whether the frequency difference determined in step 280 is the intermediate frequency. If the frequency difference is equal to the intermediate frequency, the yes branch of step 290 terminates the method. Otherwise, the no branch of step 290 returns to step 200 where the resulting signal is reprocessed until a signal at exactly the intermediate frequency is obtained.

Figure 6:
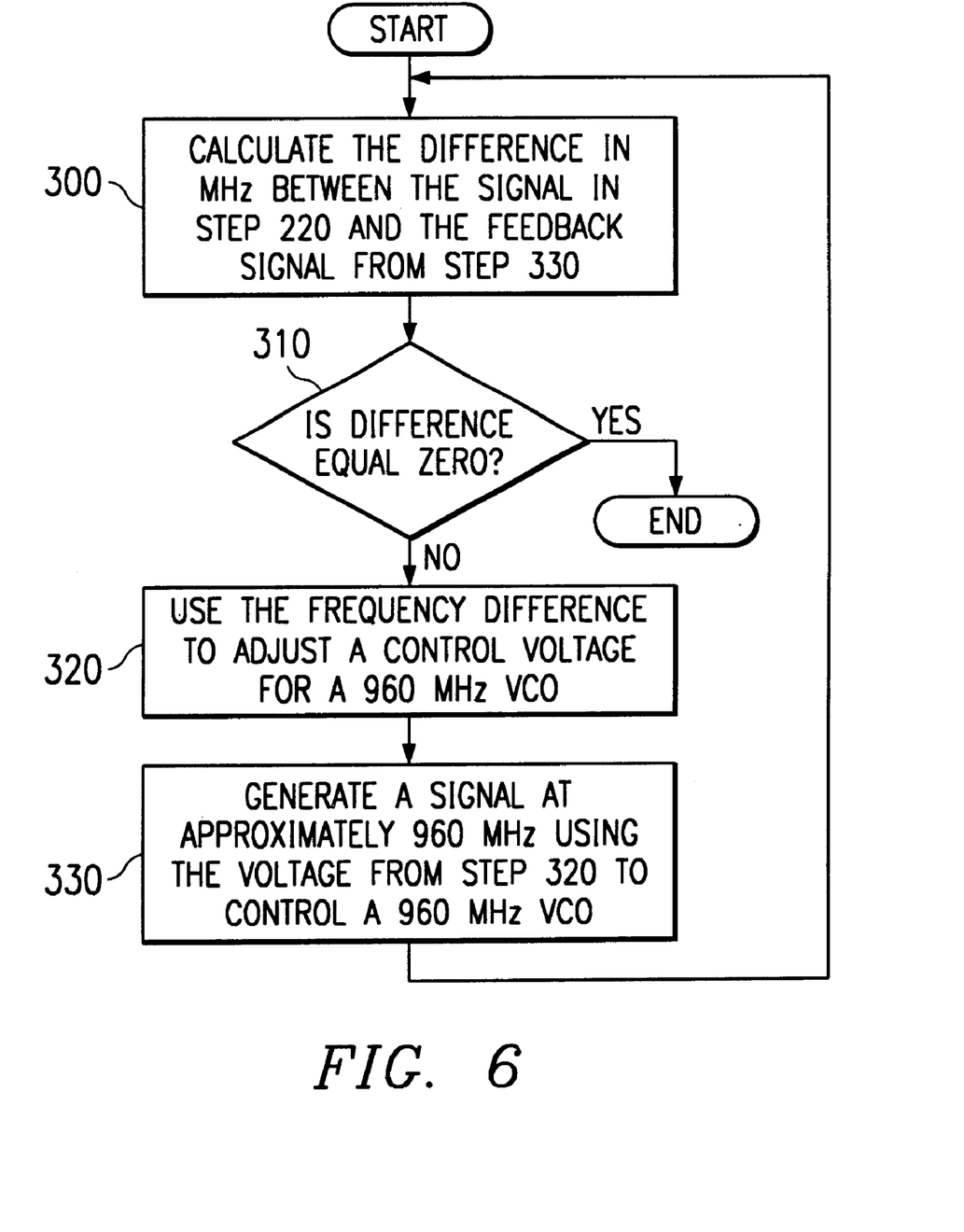
FIG. 6 is a flow diagram illustrating the process of a phase lock loop.

Referring to FIG. 6, a flowchart of step 230 in FIG. 5 is illustrated. The method commences at step 300 where a first phase detector 68 determines the difference in megahertz between filtered signal 65 and the output of VCO 72 in step 330. The method proceeds to step 310 where a determination is made whether the difference determined in step 300 is equal to zero. If the difference is equal to zero, the yes branch of decisional step 310 terminates the method. If the difference is not equal to zero, the no branch of decisional step 310 leads to step 320 where the frequency difference determined in step 300 is used to adjust a control voltage for VCO 72. Loop filter 70 analyzes the frequency difference and generates the control voltage.

The method proceeds to step 330 where a strong signal at the same frequency as filtered signal 65 is generated using VCO 72. The method proceeds from step 330 back to step 300 to insure that the output of step 330 is at the same frequency as the input to step 300. The phase lock loop 66 that uses the method of FIG. 6 is used to generate a strong, noise-free signal at the same frequency as the filtered signal 65.

Thus, it is apparent that there has been provided in accordance with the present invention, a system and method for recovering a pilot tone in an LMDS system that satisfies the advantages set forth above such as an improved signal to noise ratio and signal strength for the pilot tone. Although the present invention and its advantages have been described in detail, it should be understood that various changes, substitutions, and alterations may be readily apparent to those skilled in the art and may be made without departing from the spirit and the scope of the present invention as defined by the following claims.

What is claimed is:

1. A local multipoint distribution system difference frequency generator, comprising:

a pilot tone frequency band pass filter, the pilot tone frequency band pass filter operable to remove non-pilot tone frequencies from an intermediate frequency input signal giving a pilot tone signal at a pilot tone frequency;

a difference frequency generator operable to generate a difference frequency signal; and a control voltage generator operable to generate a control voltage in response to the pilot tone signal, the control voltage used to adjust an output frequency of the difference frequency signal generated by the difference frequency generator, wherein the control voltage generator includes:

a phase lock loop operable to remove noise and interference from the pilot tone signal, the phase lock loop operable to improve a signal-to-noise ratio of the pilot tone signal, the phase lock loop operable to generate a phase lock loop output signal, the phase lock loop output signal having the same frequency as the pilot tone signal;

a divisor operable to reduce the frequency of the phase lock loop output signal giving a stable frequency input signal;

a phase detector operable to determine a frequency difference between the stable frequency input signal and a stable frequency reference signal;

a dielectric resonant oscillator loop filter operable to generate the control voltage in response to the frequency difference.

2. The system of claim 1, further comprising:

one or more amplifiers for increasing a signal strength of the pilot tone signal.

3. The system of claim 1, wherein the phase lock loop includes:

a pilot tone frequency voltage controlled oscillator operable to generate the phase lock loop output signal, the phase lock loop output signal having the same frequency as the pilot tone signal;

a second phase detector operable to determine a second frequency difference between the pilot tone signal and the phase lock loop output signal; and a loop filter operable to generate a pilot tone control voltage in response to the second frequency difference, the pilot tone control voltage used to adjust an output frequency of the pilot tone frequency voltage controlled oscillator.

4. The system of claim 1, further comprising:

a stable frequency oscillator operable to generate the stable frequency reference signal.

5. The system of claim 1, wherein the difference frequency generator is a voltage controlled dielectric resonant oscillator.

6. A local multipoint distribution system difference frequency generator, comprising:

a pilot tone frequency band pass filter, the pilot tone frequency band pass filter operable to remove non-pilot tone frequencies from an intermediate frequency input signal giving a pilot tone signal at a pilot tone frequency;

a difference frequency generator operable to generate a difference frequency signal; and a control voltage generator operable to generate a control voltage in response to the pilot tone signal, the control voltage used to adjust an output frequency of the difference frequency signal generated by the difference frequency generator, wherein the control voltage generator includes: a pilot tone reference signal oscillator operable to generate a pilot tone reference signal at the pilot tone frequency; a pilot tone frequency phase detector coupled to the pilot tone frequency band pass filter and the pilot tone reference signal oscillator, the pilot tone frequency phase detector determining a pilot tone frequency difference between the pilot tone signal and the pilot tone reference signal; and a dielectric resonant oscillator loop filter operable to generate the control voltage in response to the pilot tone frequency difference;

wherein the pilot tone reference signal oscillator includes:
  a pilot tone frequency voltage controlled oscillator operable to generate the pilot tone reference signal at the pilot tone frequency;
  a divisor coupled to the pilot tone frequency voltage controlled oscillator and operable to reduce the frequency of the pilot tone reference signal to a stable frequency giving a divided pilot tone reference signal;
  a stable frequency oscillator for generating a stable frequency reference signal;
  a phase detector coupled to the divisor and the stable frequency oscillator, the phase detector determining a second frequency difference between the divided pilot tone reference signal and the stable frequency reference signal; and
  a loop filter for generating a pilot tone control voltage for the pilot tone frequency voltage controlled oscillator based on the second frequency difference determined by the phase detector, the pilot tone control voltage used to adjust an output frequency of the pilot tone frequency voltage controlled oscillator.

7. The method of claim 6, wherein:
the pilot tone frequency has a frequency of approximately 960 MHz; and
the stable frequency has a frequency of approximately 15 MHz.

8. A method, comprising the steps of:
receiving a radio frequency signal which includes an information component and a pilot component, said pilot component being at a predetermined pilot frequency which is less than the radio frequency of said radio frequency signal;
converting said radio frequency signal to an intermediate frequency signal as a function of a further signal;
filtering said intermediate frequency signal to obtain a pilot signal by extracting said pilot component from said intermediate frequency signal, said filtering step including the step of effecting narrow band frequency adaptive filtering;
generating a reference signal at a reference frequency; and
generating said further signal as a function of said pilot signal and said reference signal.

9. A method according to claim 8, wherein said filtering step further includes the step of effecting band pass filtering prior to said step of effecting narrow band frequency adaptive filtering.

10. A method according to claim 8, including the step of amplifying said intermediate frequency signal prior to said filtering step.

11. A method according to claim 8, wherein said step of effecting narrow band frequency adaptive filtering is carried out using a phase lock loop function that includes the steps of:
  providing a voltage controlled oscillator which generates an output signal at approximately said pilot frequency;
  generating a phase difference signal representing a phase difference between said output signal and a signal which is derived from said intermediate frequency signal and which is to be subjected to said narrow band frequency adaptive filtering;
  generating a control voltage which is a function of said phase difference signal; and
  controlling said voltage controlled oscillator using said control voltage, said pilot signal being a function of said output signal from said voltage controlled oscillator.

12. A method according to claim 11, including the step of amplifying said intermediate frequency signal prior to said filtering step.

13. A method according to claim 11, wherein said filtering step includes the step of effecting band pass filtering prior to said step of narrow band frequency adaptive filtering.

14. A method according to claim 8, including the step of selecting said pilot frequency to be a predetermined multiple of said reference frequency, and wherein said step of generating said further signal includes the steps of:
  dividing said pilot signal by said predetermined multiple to obtain a divided signal; and
  determining a phase difference signal representing a phase difference between said divided signal and said reference signal, said further signal being a function of said phase difference signal.

15. A method according to claim 14, wherein said step of generating said further signal includes the steps of:
  producing a control voltage which is a function of said phase difference signal; and
  using said control voltage to control a voltage controlled oscillator, said further signal being an output of said voltage controlled oscillator.

16. An apparatus, comprising:
  a section for receiving a radio frequency signal which includes an information component and a pilot component, said pilot component being at a predetermined pilot frequency which is less than the radio frequency of said radio frequency signal;
  a translator section for converting said radio frequency signal to an intermediate frequency signal as a function of a further signal;
  a filter section which includes a narrow band frequency adaptive filter and which filters said intermediate frequency signal to obtain a pilot signal by extracting said pilot component from said intermediate frequency signal;
  a reference signal generating section for generating a reference signal at a reference frequency; and
  a further section for generating said further signal as a function of said pilot signal and said reference signal.

17. An apparatus according to claim 16, wherein said filter section includes a band pass filter having an output which is coupled to an input of said narrow band frequency adaptive filter.

18. An apparatus according to claim 16, including an amplifier provided between said translator section and said filter section for amplifying said intermediate frequency signal.

19. An apparatus according to claim 16, wherein said narrow band frequency adaptive filter includes a phase lock loop, said phase lock loop including:

a voltage controlled oscillator which generates an output signal;

a phase detector for generating a phase difference signal which represents a phase difference between said output signal and a signal supplied to an input of said narrow band frequency adaptive filter; and a loop filter circuit which converts said phase difference signal to a control voltage, said control voltage being applied to an input of said voltage controlled oscillator.

20. An apparatus according to claim 19, including an amplifier provided between said translator section and said filter section for amplifying said intermediate frequency signal.

21. An apparatus according to claim 19, wherein said filter section includes a band pass filter having an output which is coupled to an input of said narrow band frequency adaptive filter.

22. An apparatus according to claim 16, wherein said pilot frequency is a predetermined multiple of said reference frequency, and wherein said further section includes:

a dividing circuit for dividing said pilot signal by said predetermined multiple to obtain a divided signal; and a phase detect circuit for generating a phase difference signal representing a phase difference between said divided signal and said reference signal, said further signal being a function of said phase difference signal.

23. An apparatus according to claim 22, wherein said further section includes:

a loop filter for producing a control voltage which is a function of said phase difference signal; and a voltage controlled oscillator which is responsive to said control voltage and which generates said further signal.

\* \* \* \* \*